US012672546B2

(12) United States Patent
Murayoshi et al.

(10) Patent No.: US 12,672,546 B2
(45) Date of Patent: Jun. 30, 2026

(54) SEMICONDUCTOR DEVICE AND METHOD FOR MANUFACTURING

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Aya Murayoshi, Yokohama Kanagawa (JP); Kazushiro Nomura, Kawasaki Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 615 days.

(21) Appl. No.: 18/182,824

(22) Filed: Mar. 13, 2023

(65) Prior Publication Data

US 2024/0105640 A1 Mar. 28, 2024

(30) Foreign Application Priority Data

Sep. 22, 2022 (JP) ................................. 2022-151188

(51) Int. Cl.
*H10W 42/00* (2026.01)
*H10D 30/66* (2025.01)
(Continued)

(52) U.S. Cl.
CPC ........ *H10W 42/121* (2026.01); *H10D 30/668* (2025.01); *H10W 20/0698* (2026.01); *H10W 20/484* (2026.01)

(58) Field of Classification Search
None
See application file for complete search history.

(56) References Cited

U.S. PATENT DOCUMENTS

2007/0215938 A1* 9/2007 Yanagida ............. H10D 64/252
257/E29.198
2018/0090611 A1* 3/2018 Togami .............. H10D 30/0291
2022/0262952 A1* 8/2022 Ino ........................ H10D 30/791

FOREIGN PATENT DOCUMENTS

JP 6065198 B2 1/2017
JP 2018-049974 A 3/2018
(Continued)

OTHER PUBLICATIONS

Office Action issued in Japanese Patent Application No. 2022-151188, dated Jul. 2, 2025 in 10 pages.

*Primary Examiner* — Cory W Eskridge
(74) *Attorney, Agent, or Firm* — Knobbe, Martens, Olson & Bear, LLP

(57) ABSTRACT

A semiconductor device includes a first conductive layer, a semiconductor layer, first to second control electrodes, and first to second electrode pads. The first conductive layer includes first to second conductive regions. The second conductive region is thinner than the first conductive region. The semiconductor layer is located on the first conductive layer, and includes first to fifth semiconductor regions. The first control electrode faces the first, second, and third semiconductor regions via a first insulating film. The second control electrode faces the first, fourth, and fifth semiconductor regions via a second insulating film. The first electrode pad is located above the semiconductor layer and electrically connected with the third semiconductor region. The second electrode pad is located above the semiconductor layer and electrically connected with the fifth semiconductor region. At least a portion of the first conductive region is positioned below the first and second electrode pads.

12 Claims, 8 Drawing Sheets

(51) Int. Cl.
   *H10W 20/00*      (2026.01)
   *H10W 20/40*      (2026.01)

(56)            References Cited

FOREIGN PATENT DOCUMENTS

| JP | 2019-165033 | 9/2019 |
| JP | 2020-167281 | 10/2020 |

* cited by examiner

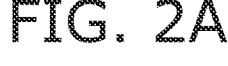
FIG. 2A
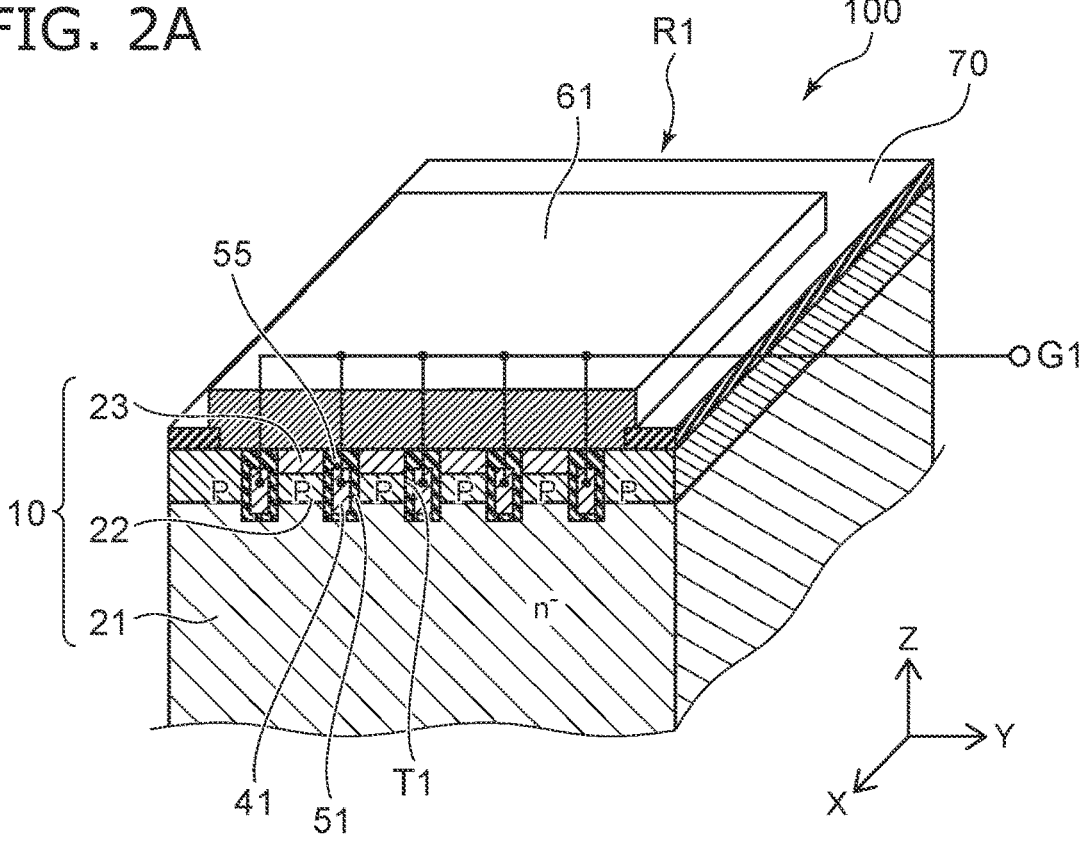
FIG. 2B
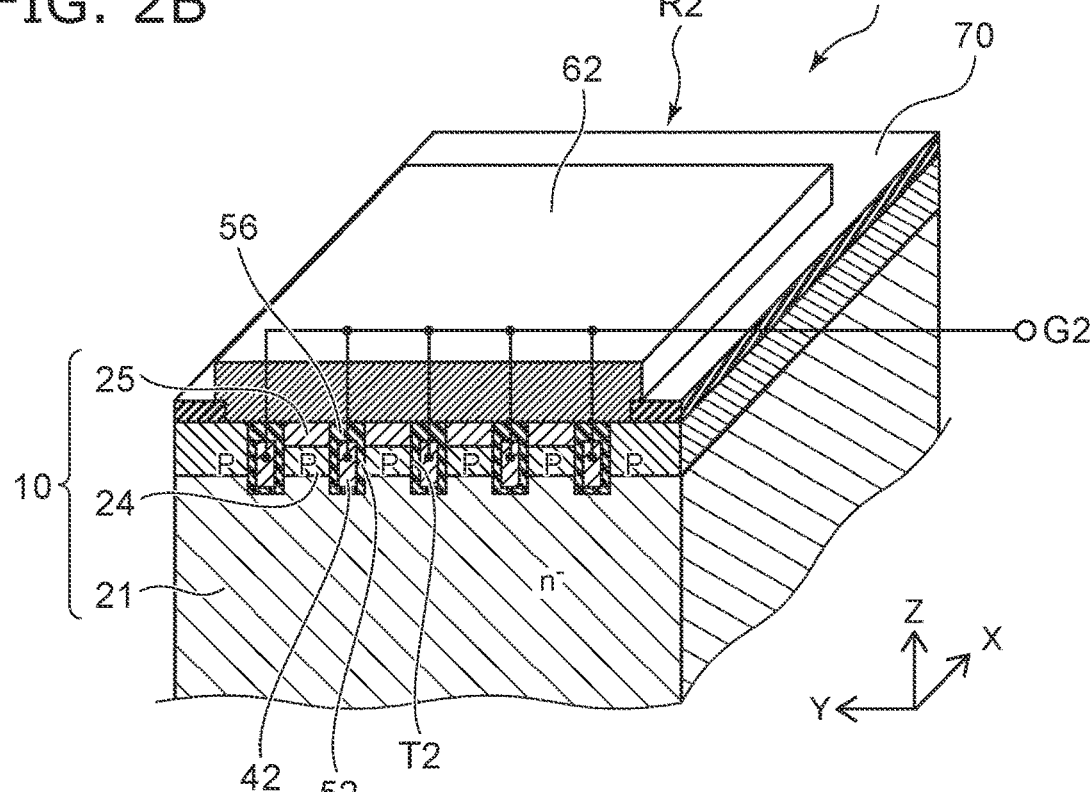

SEMICONDUCTOR DEVICE AND METHOD FOR MANUFACTURING

CROSS-REFERENCE TO RELATED APPLICATIONS

This application is based upon and claims the benefit of priority from Japanese Patent Application No. 2022-151188, filed on Sep. 22, 2022; the entire contents of which are incorporated herein by reference.

FIELD

Embodiments relate to a semiconductor device and a method for manufacturing.

BACKGROUND

Efforts to reduce the on-resistance of a semiconductor device such as a vertical MOSFET (Metal Oxide Semiconductor Field Effect Transistor) or the like include reducing the semiconductor substrate thickness and increasing the thickness of a metal layer used as a current path.

On the other hand, heat may cause warp of such a semiconductor device. For example, warp of the semiconductor device in a mounting process of soldering the semiconductor device onto a mounting substrate may cause connection defects to occur.

BRIEF DESCRIPTION OF THE DRAWINGS

FIGS. 2A and 2B are schematic perspective views illustrating portions of the semiconductor device according to the embodiment;

DETAILED DESCRIPTION

Figure 1:
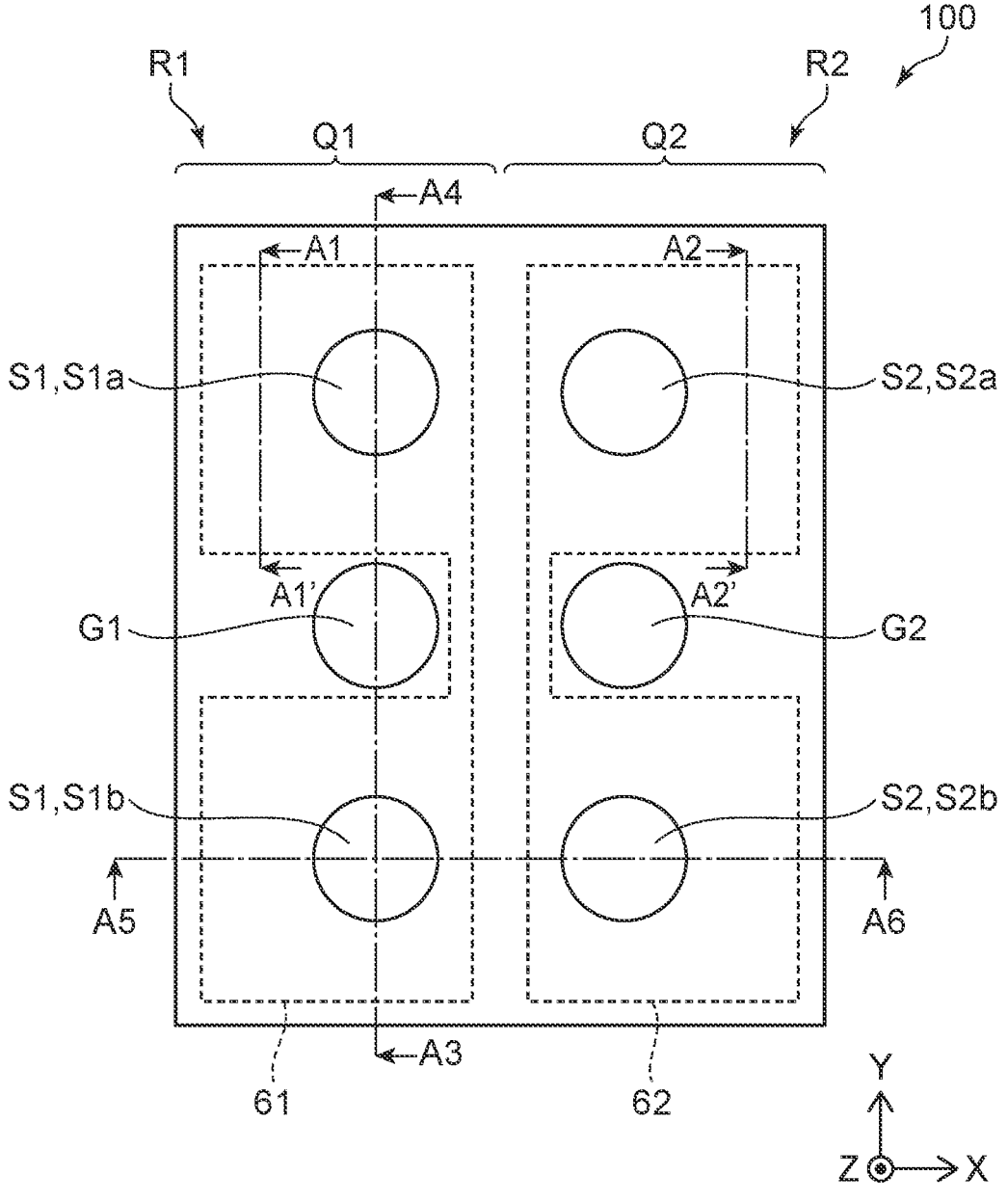
FIG. 1 is a schematic plan view illustrating a semiconductor device according to an embodiment.

A semiconductor device according to one embodiment, includes a first conductive layer, a semiconductor layer, a first control electrode, a second control electrode, a first electrode pad, and a second electrode pad. The first conductive layer includes a first conductive region and a second conductive region. An unevenness is provided in at least one of an upper surface or a lower surface of the first conductive layer. The second conductive region is thinner than the first conductive region. The semiconductor layer is located on the first conductive layer. The semiconductor layer includes a first semiconductor region, a second semiconductor region, a third semiconductor region, a fourth semiconductor region, and a fifth semiconductor region. The first semiconductor region is of a first conductivity type. The second semiconductor region is located on a portion of the first semiconductor region. The second semiconductor region is of a second conductivity type. The third semiconductor region is located on the second semiconductor region. The third semiconductor region is of the first conductivity type. The fourth semiconductor region is located on an other portion of the first semiconductor region. The fourth semiconductor region is of the second conductivity type. The fifth semiconductor region is located on the fourth semiconductor region. The fifth semiconductor region is of the first conductivity type. The first control electrode faces the first, second, and third semiconductor regions via a first insulating film. The second control electrode faces the first, fourth, and fifth semiconductor regions via a second insulating film. The first electrode pad is located above the semiconductor layer and electrically connected with the third semiconductor region. The second electrode pad is located above the semiconductor layer and electrically connected with the fifth semiconductor region. At least a portion of the first conductive region is positioned below the first and second electrode pads.

A method for manufacturing a semiconductor device according to one embodiment, includes preparing a semiconductor wafer. The semiconductor wafer includes a semiconductor layer, a first control electrode, a second control electrode, a first electrode pad, and a second electrode pad. The semiconductor layer includes a first semiconductor region, a second semiconductor region, a third semiconductor region, a fourth semiconductor region, and a fifth semiconductor region. The first semiconductor region is of a first conductivity type. The second semiconductor region is located on a portion of the first semiconductor region. The second semiconductor region is of a second conductivity type. The third semiconductor region is located on the second semiconductor region. The third semiconductor region is of the first conductivity type. The fourth semiconductor region is located on an other portion of the first semiconductor region. The fourth semiconductor region is of the second conductivity type. The fifth semiconductor region is located on the fourth semiconductor region. The fifth semiconductor region is of the first conductivity type. The first control electrode faces the first, second, and third semiconductor regions via a first insulating film. The second control electrode faces the first, fourth, and fifth semiconductor regions via a second insulating film. The first electrode pad is located above the semiconductor layer and electrically connected with the third semiconductor region. The second electrode pad is located above the semiconductor layer and electrically connected with the fifth semiconductor region. The method includes etching a lower surface side of the semiconductor layer to form a first semiconductor part and a second semiconductor part in the semiconductor layer. The second semiconductor part is thicker than the first semiconductor part. At least a portion of the first semiconductor part is positioned below the first and second electrode pads. The method includes forming a first conductive layer at the lower surface side of the semiconductor layer. The first conductive layer includes a first conductive region and a second conductive region. The first conductive region is positioned under the first semiconductor part. The second conductive region is positioned under the second semiconductor part. The second conductive region is thinner than the first conductive region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the embodiments described below, each embodiment may be implemented by inverting the p-type (an example of the second conductivity type) and the n-type (an example of the first conductivity type) of each semiconductor region.

FIG. 1 is a schematic plan view illustrating a semiconductor device according to an embodiment.

As illustrated in FIG. 1, the semiconductor device 100 according to the embodiment includes a first element region R1 and a second element region R2 arranged in an X-direction. A first element Q1 is located in the first element region R1; and a second element Q2 is located in the second element region R2. The first element Q1 and the second element Q2 are transistors.

A source electrode 61 (a conductive layer), a source electrode pad S1 (a first electrode pad), and a gate electrode pad G1 are located at the front side of the first element region R1. In the example, one gate electrode pad G1 is located between two source electrode pads S1 (source electrode pads S1a and S1b) arranged in a Y-direction. The source electrode pad S1 contacts the source electrode 61 and is electrically connected with the source electrode 61. For example, when viewed from above, the source electrode 61 is located in an area surrounding the multiple source electrode pads S1 (other than the gate electrode pad G1 and the area at the periphery of the gate electrode pad G1). The gate electrode pad G1 is electrically insulated from the source electrode pad S1 and the source electrode 61.

Similarly, a source electrode 62 (a conductive layer), a source electrode pad S2 (a second electrode pad), and a gate electrode pad G2 are located at the front side of the second element region R2. In the example, one gate electrode pad G2 is located between two source electrode pads S2 (source electrode pads S2a and S2b) arranged in the Y-direction. The source electrode pad S2 contacts the source electrode 62 and is electrically connected with the source electrode 62. For example, when viewed from above, the source electrode 62 is located in an area surrounding the multiple source electrode pads S2 (other than the gate electrode pad G2 and the area at the periphery of the gate electrode pad G2). The gate electrode pad G2 is electrically insulated from the source electrode pad S2 and the source electrode 62.

The source electrode pad S1 and the source electrode pad S2 are arranged in the X-direction. The gate electrode pad G1 and the gate electrode pad G2 are arranged in the X-direction. The arrangement and shapes of the source electrodes and the electrode pads illustrated in FIG. 1 are examples and are not limited to the illustrated embodiment.

FIGS. 2A and 2B are schematic perspective views illustrating portions of the semiconductor device according to the embodiment.

FIG. 2A illustrates a portion of a cross section along line A1-A1' illustrated in FIG. 1. FIG. 2B illustrates a portion of a cross section along line A2-A2' illustrated in FIG. 1. Some of the components (a lower electrode 11 (see FIG. 3), the source electrode pads S1 and S2, passivation layers, etc.) are not illustrated in FIGS. 2A and 2B. The connections between gate electrodes 41 and 42 and the gate electrode pads G1 and G2 are schematically shown by circuit diagrams.

Figure 3:
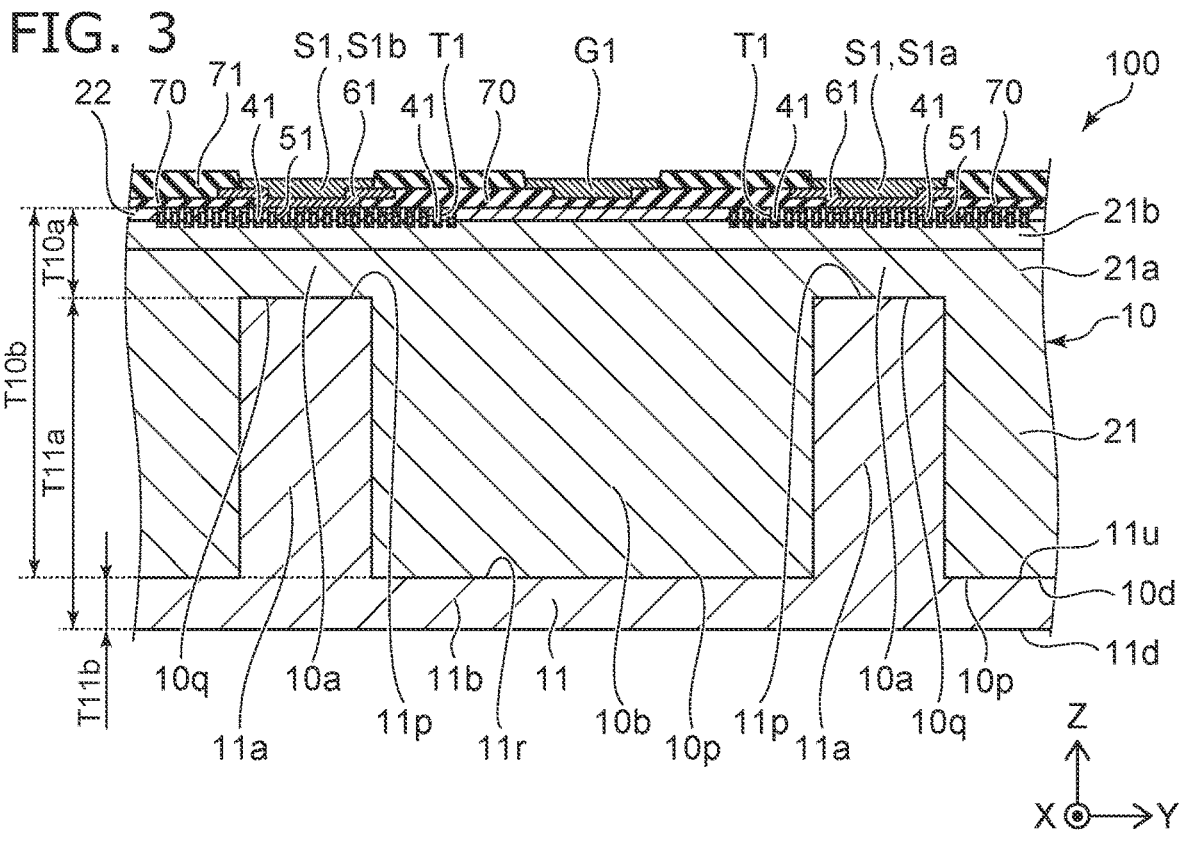
FIG. 3 is a schematic cross-sectional view illustrating the semiconductor device according to the embodiment.

The semiconductor device 100 according to the embodiment includes a semiconductor layer 10 (a semiconductor substrate) and the lower electrode 11 (a first conductive layer) illustrated in FIG. 3.

In the description of the embodiment, the direction from the lower electrode 11 toward the semiconductor layer 10 is taken as a Z-direction (a first direction); one direction perpendicular to the Z-direction is taken as the X-direction (a second direction); and a direction perpendicular to the Z-direction and the X-direction is taken as the Y-direction (a third direction). For example, the X-direction and the Y-direction are parallel to the front surface of the semiconductor layer 10 (the semiconductor substrate). Also, in the description, the direction from the lower electrode 11 toward the semiconductor layer 10 is called "up", and the opposite direction is called "down". These directions are based on the relative positional relationship between the lower electrode 11 and the semiconductor layer 10 and are independent of the direction of gravity. For example, the Z-direction is perpendicular to the upper surface of the semiconductor substrate.

The semiconductor layer 10 is located on the lower electrode 11. As illustrated in FIG. 2A, the semiconductor layer 10 includes a semiconductor region 21 (a first semiconductor region), a base region 22 (a second semiconductor region), and a source region 23 (a third semiconductor region). As illustrated in FIG. 2B, the semiconductor layer 10 further includes a base region 24 (a fourth semiconductor region) and a source region 25 (a fifth semiconductor region).

The lower electrode 11 and the semiconductor region 21 are provided over the first element region R1 and the second element region R2. The semiconductor region 21 is located on the lower electrode 11 and is of an n-type (a first conductivity type). For example, to provide an ohmic contact with the lower electrode 11, the portion of the semiconductor region 21 contacting the lower electrode 11 has a higher n-type impurity concentration than the upper portion of the semiconductor region 21.

The base region 22 is located on the semiconductor region 21 in the first element region R1 and is of a p-type (a second conductivity type). The source region 23 is selectively located on the base region 22 and is of the first conductivity type. In the example, multiple source regions 23 are provided, and the multiple source regions 23 are arranged in the Y-direction.

A gate electrode 41 (a first control electrode) and a gate insulating film 51 (a first insulating film) also are located in the first element region R1. The first element Q1 is a field-effect transistor (e.g., a Metal-Oxide-Semiconductor Field-Effect Transistor (MOSFET)) formed of the gate insulating film 51, the gate electrode 41, the source region 23, the base region 22, and a portion of the semiconductor region 21.

The gate electrode 41 is located on the semiconductor region 21 via the gate insulating film 51. The gate electrode 41 faces a portion of the semiconductor region 21, the base region 22, and a portion of the source region 23 via the gate insulating film 51. In the example, multiple gate electrodes 41 and multiple gate insulating films 51 are provided. The multiple gate electrodes 41 are arranged in the Y-direction; and each gate electrode 41 extends in the X-direction.

Multiple trenches T1 are formed on the semiconductor region 21. The multiple trenches T1 are arranged in the Y-direction; and each trench T1 extends in the X-direction. Each trench T1 is located in the source region 23 and the base region 22 and reaches the semiconductor region 21. The gate insulating film 51 is located in each trench T1; and the gate electrode 41 is located on the gate insulating film 51. Also, an insulating part 55 is located between the gate electrode 41 and the source electrode 61 in each trench T1.

For example, the base region 22 is located in a region (a first under-pad region) including the region below one source electrode pad S1 shown in FIG. 1 and in a region (a second under-pad region) including the region below the other source electrode pad S1 shown in FIG. 1. The multiple trenches T1, the multiple gate electrodes 41, the multiple gate insulating films 51, and the multiple source regions 23 are arranged in the Y-direction in the first and second under-pad regions. Each trench T1, each gate electrode 41, each gate insulating film 51, and each source region 23 extend in the X-direction in the first and second under-pad regions.

The gate electrodes 41 are electrically connected with the gate electrode pad G1 illustrated in FIG. 1 via conductive parts such as not-illustrated gate contacts, gate interconnects, etc. For example, the gate interconnects are located at the upper surface of the semiconductor layer 10 and connected to the gate electrode pad G1. For example, the gate contacts extend vertically to extend through portions of the insulating part 55 and connect the gate electrodes 41 and the gate interconnects. However, the connection method and the connection positions of the gate electrodes and the gate electrode pad are not particularly limited.

The source electrode 61 is located on the multiple source regions 23 and electrically connected with the source regions 23. In other words, the source electrode pad S1 is electrically connected with the source regions 23 via the source electrode 61. The source electrode pad S1 overlaps a portion of the source electrode 61, a portion of the source region 23, a portion of the base region 22, and a portion of the gate electrode 41 in the Z-direction. The gate electrode 41 and the source electrode 61 are electrically insulated from each other by the insulating part 55.

The configuration of the second element region R2 may be similar to the configuration of the first element region R1.

In other words, in the second element region R2, the base region 24 is located on the semiconductor region 21 and is of the p-type (the second conductivity type). The source region 25 is selectively located on the base region 24 and is of the first conductivity type. The multiple source regions 25 are arranged in the Y-direction.

The gate electrode 42 (a second control electrode) and a gate insulating film 52 (a second insulating film) are located in the second element region R2. The second element Q2 is a field-effect transistor formed of the gate insulating film 52, the gate electrode 42, the source region 25, the base region 24, and a portion of the semiconductor region 21.

The gate electrode 42 is located on the semiconductor region 21 with the gate insulating film 52 interposed. The gate electrode 42 faces a portion of the semiconductor region 21, the base region 24, and a portion of the source region 25 via the gate insulating film 52. The multiple gate electrodes 42 are arranged in the Y-direction; and each gate electrode 42 extends in the X-direction.

Multiple trenches T2 are formed on the semiconductor region 21. The multiple trenches T2 are arranged in the Y-direction; and each trench T2 extends in the X-direction. Each trench T2 is located in the source region 25 and the base region 24 and reaches the semiconductor region 21. The gate insulating film 52 is located in each trench T2; and the gate electrode 42 is located on the gate insulating film 52. Also, an insulating part 56 is located between the gate electrode 42 and the source electrode 62 in each trench T2.

For example, the base region 24 is located in a region (a third under-pad region) including the region below one source electrode pad S2 shown in FIG. 1 and in a region (a fourth under-pad region) including the region below the other source electrode pad S2 shown in FIG. 1. The multiple trenches T2, the multiple gate electrodes 42, the multiple gate insulating films 52, and the multiple source regions 25 are arranged in the Y-direction in the third and fourth under-pad regions. Each trench T2, each gate electrode 42, each gate insulating film 52, and each source region 25 extends in the X-direction in the third and fourth under-pad regions.

The source electrode 62 is located on the multiple source regions 25 and electrically connected with the source regions 25. In other words, the source electrode pad S2 is electrically connected with the source regions 25 via the source electrode 62. The source electrode pad S2 overlaps a portion of the source electrode 62, a portion of the source region 25, a portion of the base region 24, and a portion of the gate electrode 42 in the Z-direction. The gate electrode 42 and the source electrode 62 are electrically insulated by the insulating part 56.

An insulating layer 70 is located between the source electrode 61 and the source electrode 62 on the semiconductor layer 10. Although only five gate electrodes and only five trenches are displayed for convenience in FIGS. 2A and 2B, the numbers of gate electrodes and trenches according to the embodiment are arbitrary, and gate electrodes and/or trenches also may be arranged as in FIG. 3 below, etc.

Figure 4:
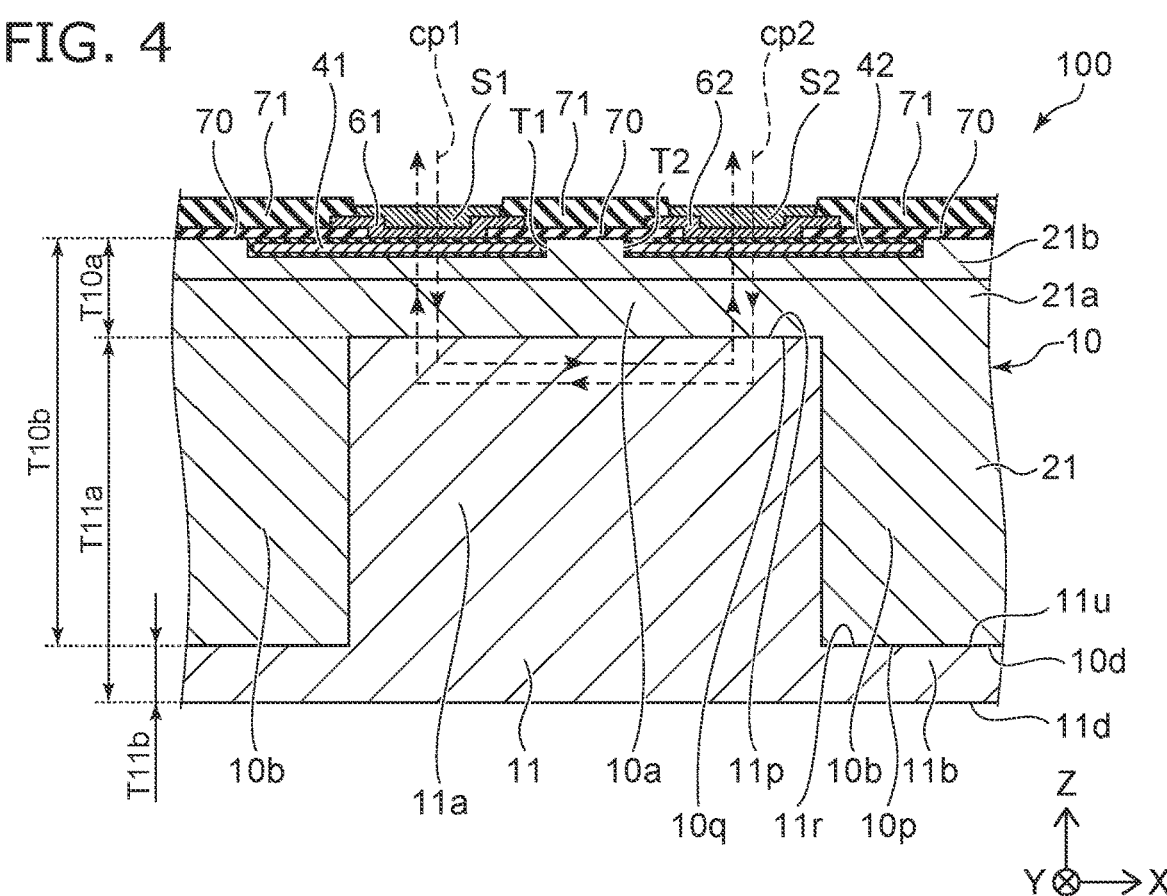
FIG. 4 is a schematic cross-sectional view illustrating the semiconductor device according to the embodiment.

FIGS. 3 and 4 are schematic cross-sectional views illustrating the semiconductor device according to the embodiment.

FIG. 3 illustrates a cross section along line A3-A4 illustrated in FIG. 1. FIG. 4 illustrates a cross section along line A5-A6 illustrated in FIG. 1.

As illustrated in FIGS. 3 and 4, a passivation layer 71 (an insulating layer) covers the source electrode 61, the source electrode 62, and the insulating layer 70. The source electrode pad S1 contacts the source electrode 61 in an opening extending through the passivation layer 71. The source electrode pad S2 contacts the source electrode 62 in another opening extending through the passivation layer 71. For example, the semiconductor region 21 includes a drain layer 21a, and a drift layer 21b located on the drain layer 21a. The concentration of the n-type impurity of the drain layer 21a is greater than the concentration of the n-type impurity of the drift layer 21b.

An unevenness is provided in at least one of an upper surface 11u or a lower surface 11d of the lower electrode 11. In the example, an unevenness (a recess 11r and a protrusion 11p that protrudes higher than the recess 11r) are provided in the upper surface 11u. The lower surface 11d is flatter than the upper surface 11u (e.g., a plane).

The lower electrode 11 includes a first conductive region 11a that includes the protrusion 11p, and a second conductive region 11b that includes the recess 11r. A thickness $T11b$ of the second conductive region 11b is less than a thickness $T11a$ of the first conductive region 11a. The thickness is the length along the Z-direction. The thickness T11$a$ is, for example, not less than 0.2 μm and not more than 50 μm. The thickness T11$b$ is, for example, not less than 0.2 μm and not more than 50 μm.

For example, as illustrated in FIG. 4, at least a portion of the first conductive region 11$a$ is positioned below the source electrode pad S1 and below the source electrode pad S2. In other words, the first conductive region 11$a$ overlaps the source electrode pads S1 and S2 in the Z-direction.

For example, the first conductive region 11$a$ is continuous at least from a region below the source electrode pad S1 to a region below the source electrode pad S2. That is, the first conductive region 11$a$ is continuous from a region below the first element Q1 described above (below the gate electrodes 41 and the source regions 23) to a region below the second element Q2 (below the gate electrodes 42 and the source regions 25).

As illustrated in FIG. 3, at least a portion of the second conductive region 11$b$ does not overlap the source electrode pad S1 in the Z-direction. The second conductive region 11$b$ is positioned below the region between one source electrode pad S1 (the source electrode pad S1$a$) and another source electrode pad S1 (the source electrode pad S1$b$) in the Z-direction. In the example, a portion of the second conductive region 11$b$ is positioned below the gate electrode pad G1.

Although not illustrated, the cross section at the second element region R2 side (the cross section passing through the source electrode pad S2 and the gate electrode pad G2) may be similar to the cross section at the first element region R1 side illustrated in FIG. 3. In other words, at least a portion of the second conductive region 11$b$ does not overlap the source electrode pad S2 in the Z-direction. The second conductive region 11$b$ is positioned below the region between one source electrode pad S2 (the source electrode pad S2$a$) and another source electrode pad S2 (the source electrode pad S2$b$) in the Z-direction. In the example, a portion of the second conductive region 11$b$ is positioned below the gate electrode pad G2.

In the example as illustrated in FIGS. 3 and 4, an unevenness (a recess 10$q$ and a protrusion 10$p$ protruding lower than the recess 10$q$) is provided in a lower surface 10$d$ of the semiconductor layer 10 along the upper surface of the lower electrode 11. The recess 10$q$ contacts the protrusion 11$p$ of the lower electrode 11; and the protrusion 10$p$ contacts the recess 11$r$ of the lower electrode 11. The semiconductor layer 10 includes a first semiconductor part 10$a$ located on the first conductive region 11$a$, and a second semiconductor part 10$b$ located on the second conductive region 11$b$. The first semiconductor part 10$a$ includes the recess 10$q$; and the second semiconductor part 10$b$ includes the protrusion 10$p$. A thickness T10$a$ of the first semiconductor part 10$a$ is less than a thickness T10$b$ of the second semiconductor part 10$b$. The thickness T10$a$ is, for example, not less than 10 μm and not more than 100 μm. The thickness T10$b$ is, for example, not less than 10 μm and not more than 150 μm. The upper surface of the semiconductor layer 10 may be flatter than the lower surface 10$d$ (e.g., a plane).

For example, the thickness T10$a$ of the first semiconductor part 10$a$ is less than the thickness T11$a$ of the first conductive region 11$a$. For example, the thickness T11$b$ of the second conductive region 11$b$ is less than the thickness of the second semiconductor part 10$b$.

Figure 5:
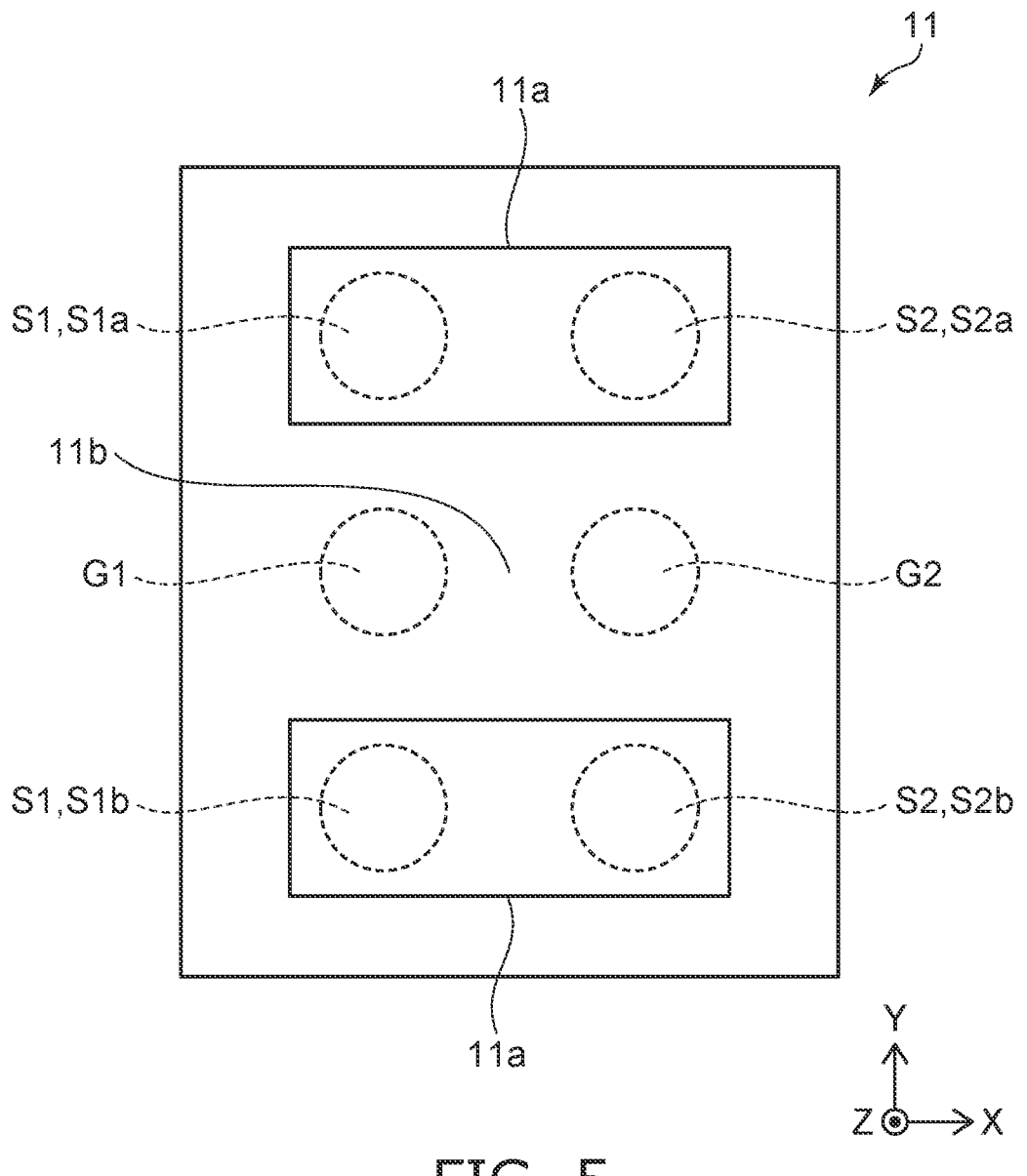
FIG. 5 is a schematic plan view illustrating the lower electrode of the semiconductor device according to the embodiment.

FIG. 5 is a schematic plan view illustrating the lower electrode of the semiconductor device according to the embodiment.

The positions of the source electrode pads S1 and S2 and the gate electrode pads G1 and G2 are illustrated by broken lines in FIG. 5.

As illustrated in FIG. 5, the area in which the first conductive region 11$a$ is located surrounds the source electrode pads S1 and S2 in the X-Y plane. More specifically, in the example, the planar shape of one first conductive region 11$a$ is a rectangle surrounding the source electrode pads S1$a$ and S2$a$ when viewed from above. The planar shape of one other first conductive region 11$a$ is a rectangle surrounding the source electrode pads S1$b$ and S2$b$ when viewed from above. The second conductive region 11$b$ is the region other than the two first conductive regions 11$a$ described above and surrounds the periphery of the two first conductive regions 11$a$ when viewed from above.

The source electrode pad S2$a$ is, for example, the source electrode pad S2 among the multiple source electrode pads S2 most proximate to the source electrode pad S1$a$. Similarly, the source electrode pad S2$b$ is, for example, the source electrode pad S2 among the multiple source electrode pads S2 most proximate to the source electrode pad S1$b$.

Examples of the materials of the components of the semiconductor device 100 will now be described.

The semiconductor region 21, the base regions 22 and 24, and the source regions 23 and 25 include silicon, silicon carbide, gallium nitride, or gallium arsenide as a semiconductor material. Arsenic, phosphorus, or antimony can be used as the n-type impurity when silicon is used as the semiconductor material. Boron can be used as the p-type impurity. For example, the base regions 22 and 24 and the source regions 23 and 25 can be formed by ion-implanting impurities into a silicon semiconductor substrate. The semiconductor substrate can be used as at least a portion of the semiconductor region 21. Impurities may be ion-implanted into a portion of the semiconductor region 21 as well.

The gate electrode 41 and the gate electrode 42 include a conductive material such as polysilicon doped with an impurity, etc.

The gate insulating film 51, the gate insulating film 52, the insulating part 55, and the insulating part 56 include an insulating material such as silicon oxide, etc.

The lower electrode 11, the source electrodes 61 and 62, the source electrode pads S1 and S2, and the gate electrode pads G1 and G2 include a metal such as aluminum, copper, silver, titanium, tungsten, etc. The electrical resistivity (Ω·cm) of the lower electrode 11 is less than the electrical resistivity of the semiconductor layer 10.

Operations of the semiconductor device 100 will now be described.

As described above, the semiconductor device 100 includes the first element Q1 and the second element Q2 that operate as transistors. For example, the lower electrode 11 performs the role of the drain electrode for the first and second elements Q1 and Q2. In other words, the first element Q1 and the second element Q2 have structures sharing the drain electrode.

The semiconductor device 100 is operated by applying a gate bias to the gate electrodes 41 and 42 in a state in which a voltage is applied between the source electrode 61 and the source electrode 62. For example, when the MOSFETs are switched on by applying the gate bias to the gate electrodes 41 and 42, a current flows from the source electrode 61 toward the source electrode 62 as in a path cp1 shown in FIG. 4 or flows from the source electrode 62 toward the source electrode 61 as in a path cp2 shown in FIG. 4.

The path cp1 is the path from the source electrode pad S1 to the source electrode pad S2 via the source electrode 61, the semiconductor layer 10 (the first semiconductor part 10a) below the source electrode pad S1, the lower electrode 11 (the first conductive region 11a), the semiconductor layer 10 (the first semiconductor part 10a) below the source electrode pad S2, and the source electrode 62. The path cp2 is a path traced along the reverse of the path cp1 described above.

Effects of the embodiment will now be described.

For example, efforts to reduce the on-resistance or the like of a semiconductor device include reducing the thickness of the semiconductor layer and/or increasing the thickness of the lower electrode. On the other hand, for example, when heat is applied to the semiconductor device in a mounting process of soldering the semiconductor device onto a mounting substrate (e.g., solder reflow), etc., there are cases where stress is generated in the semiconductor device by the difference between the thermal expansion of the lower electrode and the thermal expansion of the semiconductor layer, and warp may occur in the semiconductor device. For example, when the lower electrode is thick, there is a risk that warp may easily occur in the semiconductor device due to the stress generated in the semiconductor device by the heat. Also, there is a risk that warp may easily occur in the semiconductor device when the semiconductor layer is thin.

In contrast, according to the embodiment, the lower electrode 11 includes the first conductive region 11a, and the second conductive region 11b that is thinner than the first conductive region 11a. By providing the relatively thin second conductive region 11b, the thickness of the lower electrode 11 can be suppressed, and the warping stress on the semiconductor device due to the lower electrode 11 can be suppressed. On the other hand, at least a portion of the relatively thick first conductive region 11a is positioned below the source electrode pads S1 and S2. That is, the lower electrode 11 that has a low resistivity is thick in the current paths such as the paths cp1 and cp2 described above. The electrical resistance of the current paths can be reduced thereby, and the on-resistance of the semiconductor device can be reduced. Accordingly, according to the embodiment, the warp of the semiconductor device can be suppressed while reducing the on-resistance.

Also, the semiconductor layer 10 includes the first semiconductor part 10a and the second semiconductor part 10b. The first semiconductor part 10a is located on the first conductive region 11a and is thinner than the second semiconductor part 10b. For example, the first semiconductor part 10a may be thinner than the first conductive region 11a. By making the first semiconductor part 10a relatively thin, the length of the semiconductor layer 10 in the current path can be shortened. The electrical resistance of the semiconductor layer 10 in the current path can be further reduced thereby. Accordingly, the on-resistance of the semiconductor device can be further reduced. Also, for example, the second conductive region 11b may be thinner than the second semiconductor part 10b. By making the second conductive region 11b relatively thin, the thickness of the lower electrode 11 can be suppressed, and the warping stress on the semiconductor device due to the lower electrode 11 can be relaxed further.

As described above, the first conductive region 11a is continuous from a region below the source electrode pad S1 to a region below the source electrode pad S2. The area in which the first conductive region 11a is located surrounds the source electrode pads S1 and S2 in the X-Y plane. In other words, the lower electrode 11 is made thick at the portion at which the current density is relatively high according to the element pattern. The on-resistance can be further suppressed thereby. In the example, an unevenness is provided in the upper surface 11u of the lower electrode 11 contacting the semiconductor layer 10 according to the element pattern. On the other hand, for example, the second conductive region 11b does not overlap the source electrode pads S1 and S2 in the Z-direction. In other words, the lower electrode 11 is made thin at the portion at which the current density is relatively low according to the element pattern. The warp of the semiconductor device can be further suppressed thereby. Thus, by providing the portion at which the lower electrode 11 is thick (the portion at which the semiconductor layer 10 is thin) according to the element pattern, the warp of the semiconductor device can be suppressed while further suppressing the on-resistance.

Figure 6A:
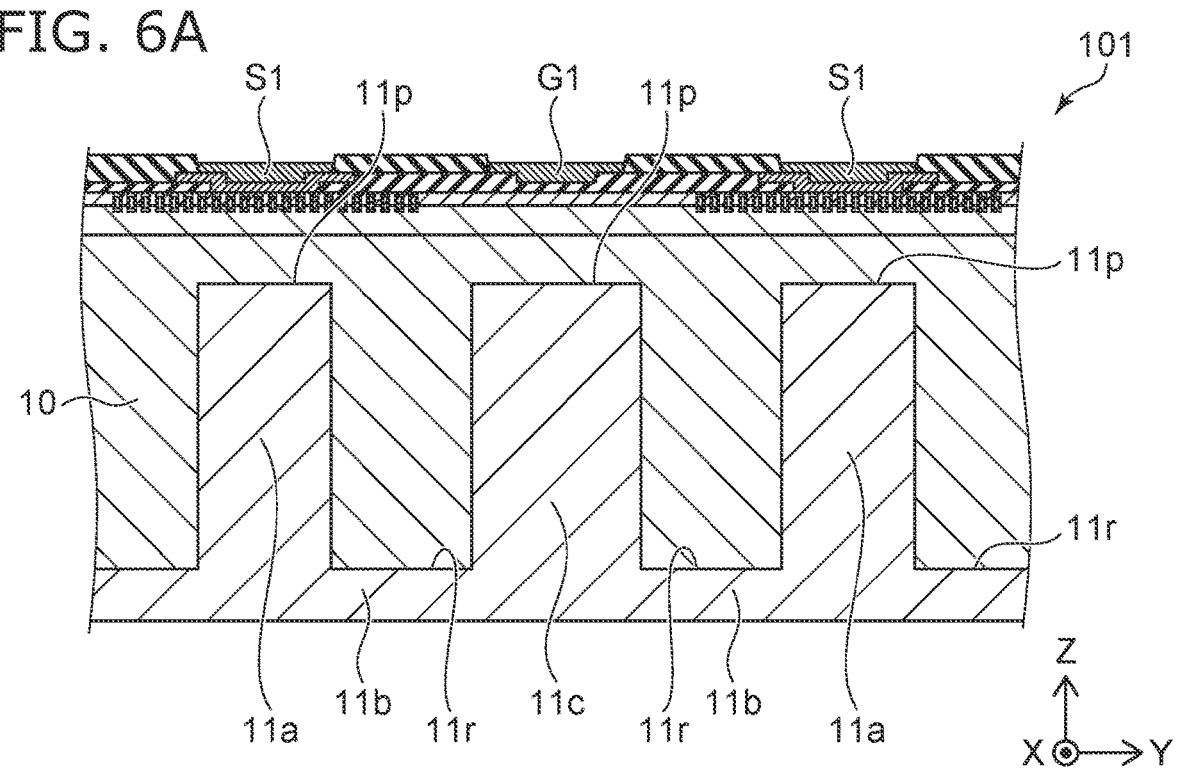
FIGS. 6A and 6B are schematic cross-sectional views illustrating semiconductor devices according to modifications of the embodiment.
Figure 6B:
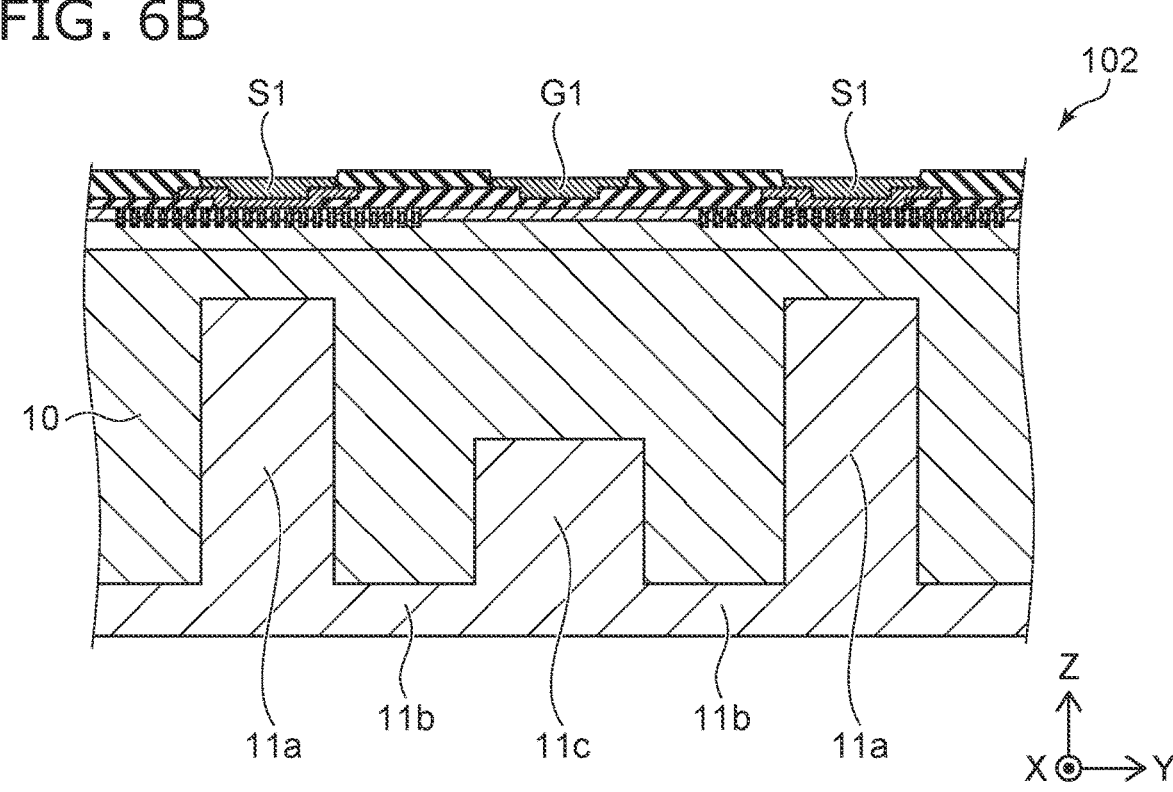

FIGS. 6A and 6B are schematic cross-sectional views illustrating semiconductor devices according to modifications of the embodiment.

In the semiconductor device 101 illustrated in FIG. 6A and the semiconductor device 102 illustrated in FIG. 6B, the lower electrode 11 further includes a conductive region 11c. The conductive region 11c is thicker than the second conductive region 11b. In the example of FIG. 6A, the thickness of the conductive region 11c is equal to the thickness of the first conductive region 11a. As in FIG. 6B, the thickness of the conductive region 11c may be less than the thickness of the first conductive region 11a.

The conductive region 11c is positioned below the region between the two source electrode pads S1. For example, the conductive region 11c is positioned below the gate electrode pad G1. The conductive region 11c also may be located below the region between the two source electrode pads S2. For example, by providing the relatively thick conductive region 11c, the on-resistance is easily reduced by increasing the region in which the lower electrode 11 is thick and the semiconductor layer 10 is thin.

Figure 7:
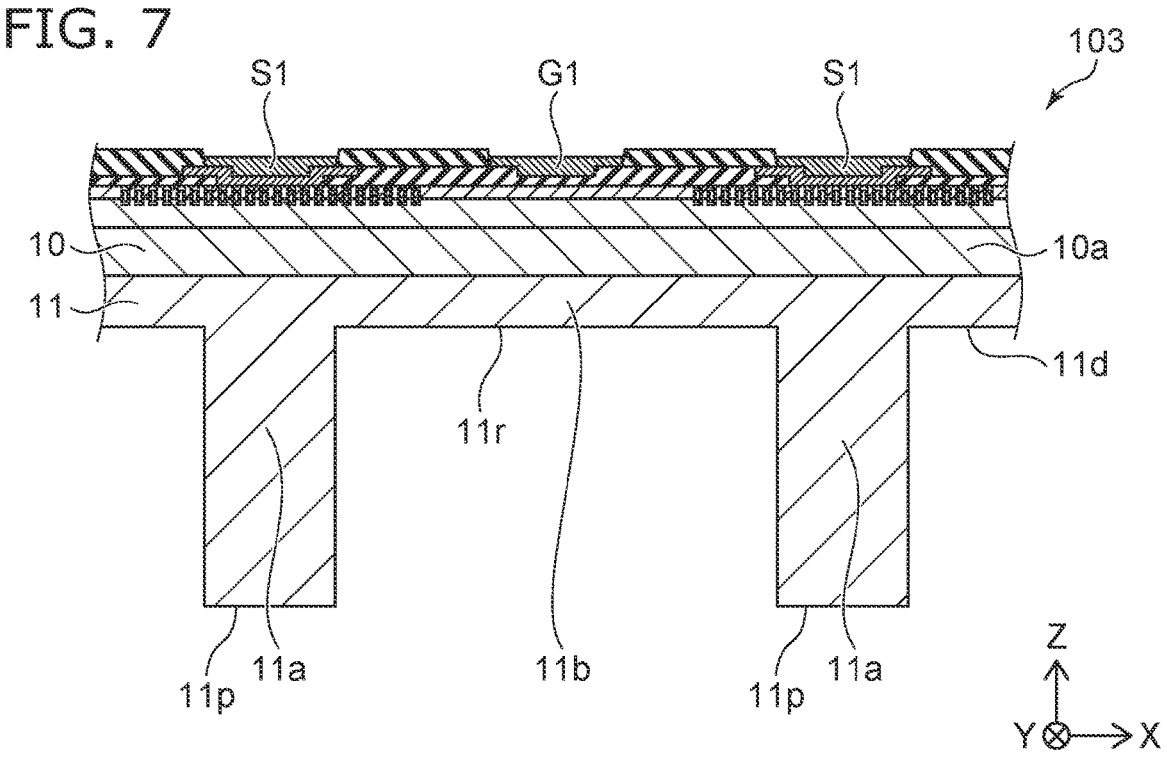
FIG. 7 is a schematic cross-sectional view illustrating a semiconductor device according to a modification of the embodiment.

FIG. 7 is a schematic cross-sectional view illustrating a semiconductor device according to a modification of the embodiment.

In the semiconductor device 103 illustrated in FIG. 7, the entire semiconductor layer 10 is thinned. In other words, in the example, the relatively thick second semiconductor part 10b is not included, and the entire semiconductor layer 10 is used as the first semiconductor part 10a. In the example, an unevenness (the recess 11r and the protrusion 11p protruding lower than the recess 11r) are provided in the lower surface 11d of the lower electrode 11. The upper surface of the lower electrode 11 is flatter than the lower surface 11d (e.g., a plane).

By making the entire semiconductor layer 10 thin, the length of the semiconductor layer 10 in the current path can be reduced, and the electrical resistance can be further reduced. Accordingly, it is easy to further reduce the on-resistance of the semiconductor device 100.

Figure 8:
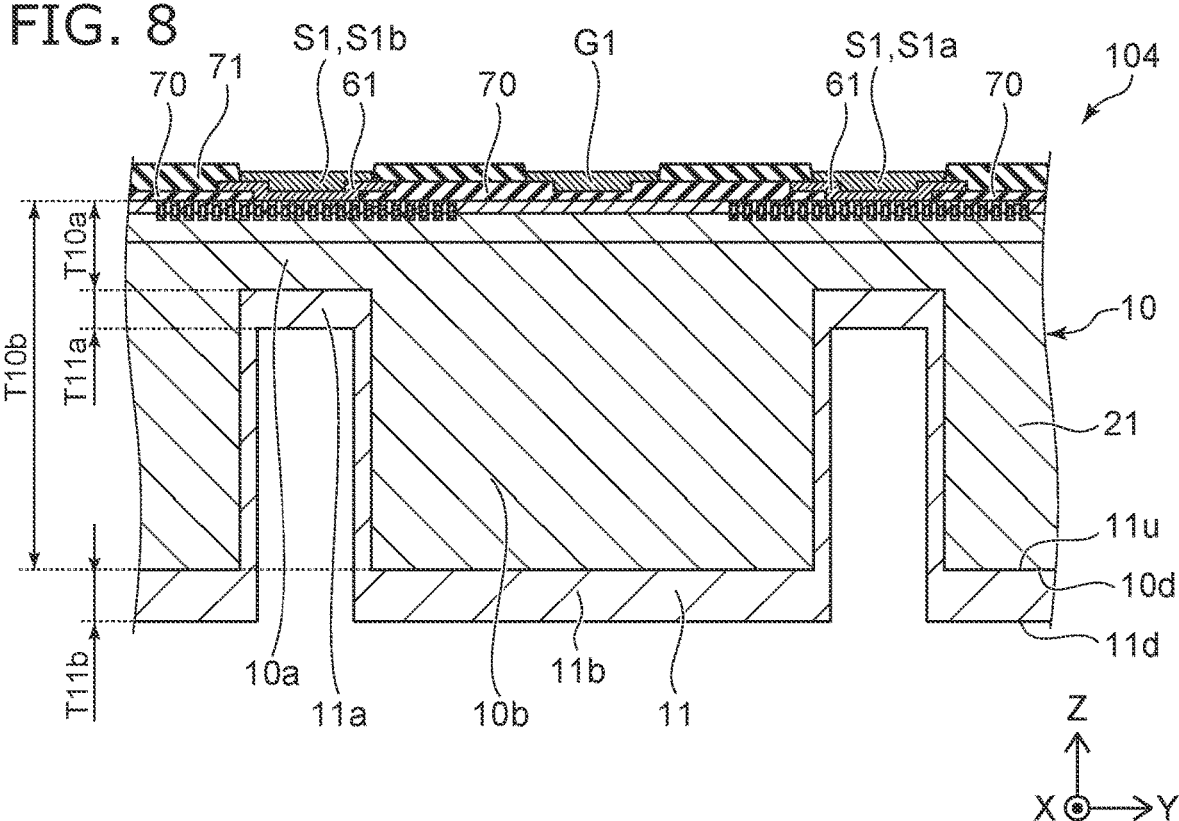
FIG. 8 is a schematic cross-sectional view illustrating a semiconductor device according to a modification of the embodiment.
Figure 9:
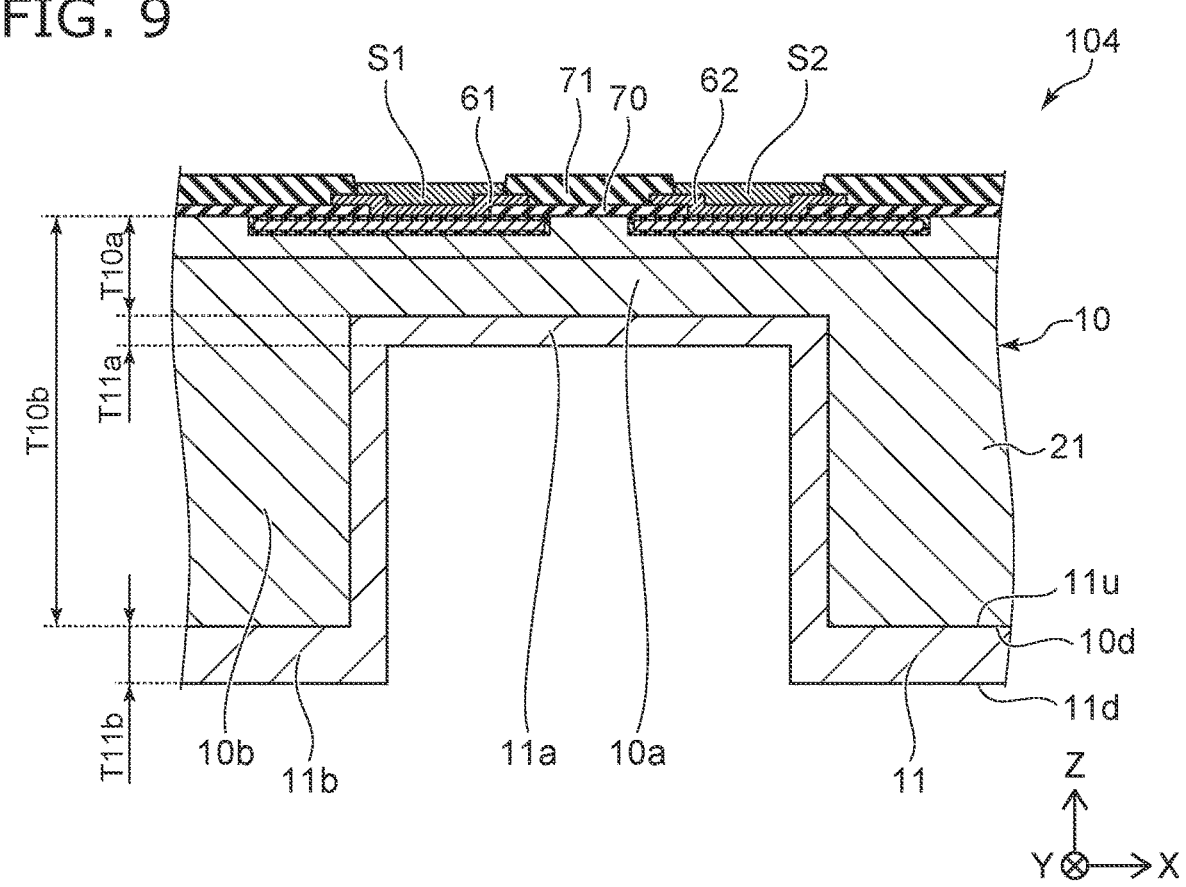
FIG. 9 is a schematic cross-sectional view illustrating a semiconductor device according to a modification of the embodiment.

FIGS. 8 and 9 are schematic cross-sectional views illustrating a semiconductor device according to a modification of the embodiment. In the example as well, the lower electrode 11 includes the first conductive region 11a and the second conductive region 11b. The first conductive region 11a includes portions positioned directly under the source electrode pad S1 and/or the source electrode pad S2. The second conductive region 11b includes a portion positioned directly under a region between the two source electrode pads S1 (e.g., directly under the gate electrode pad G1).

However, the thickness of the first conductive region 11a of the semiconductor device 104 illustrated in FIGS. 8 and 9 is different from that of the semiconductor device 100 illustrated in FIGS. 3 and 4. Otherwise, the semiconductor device 104 may be similar to the semiconductor device 100.

In the semiconductor device 104, the upper surface 11$u$ and the lower surface 11$d$ of the lower electrode 11 each include unevennesses along the lower surface of the semiconductor layer 10. For example, the thickness T10$a$ of the first semiconductor part 10$a$ may be greater than the thickness T11$a$ of the first conductive region 11$a$. The thickness T10$b$ of the second semiconductor part 10$b$ may be greater than the thickness T11$a$ of the first conductive region 11$a$.

The thickness T11$a$ of the first conductive region 11$a$ may be equal to the thickness T11$b$ of the second conductive region. Or, the thickness T11$a$ may be greater or less than the thickness T11$b$.

In the example of FIGS. 8 and 9 as well, the first semiconductor part 10$a$ is thinner than the second semiconductor part 10$b$. Similarly to the semiconductor device 100 described above, etc., the on-resistance can be suppressed by making the first semiconductor part 10$a$ relatively thin. The warp of the semiconductor layer 10 can be suppressed by making the semiconductor layer 10 partially thin and by making the rest of the semiconductor layer 10, i.e., the second semiconductor part 10$b$, thick. For example, when the first conductive region 11$a$ is thinner than the first semiconductor part 10$a$ or the second semiconductor part 10$b$, the thickness of the lower electrode 11 can be suppressed, and the warp of the semiconductor device can be suppressed.

FIGS. 10A to 10G are schematic cross-sectional views illustrating a method for manufacturing the semiconductor device according to the embodiment.

Figure 10A:
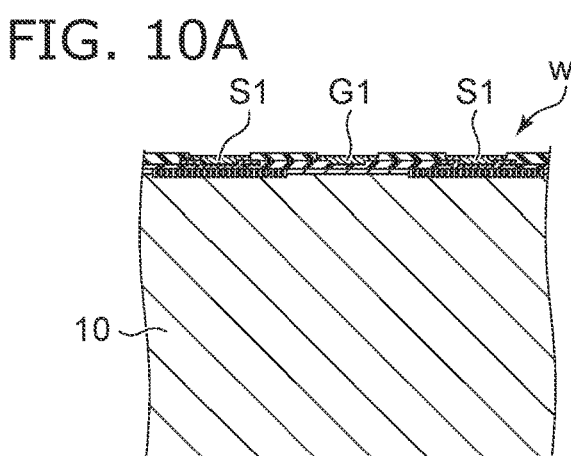
FIGS. 10A to 10G are schematic cross-sectional views illustrating a method for manufacturing the semiconductor device according to the embodiment.

According to the method for manufacturing the semiconductor device 100, a semiconductor wafer Wf is prepared as illustrated in FIG. 10A. Similarly to the example of FIGS. 1 to 5, the semiconductor wafer Wf includes the semiconductor layer 10, the gate electrode pad G1, and the source electrode pad S1. Although not illustrated, similarly to the example of FIGS. 1 to 5, the semiconductor wafer Wf includes the gate electrodes 41 and 42, the gate insulating films 51 and 52, the gate electrode pad G2, and the source electrode pad S2. The semiconductor layer 10 includes the semiconductor region 21, the base regions 22 and 24, and the source regions 23 and 25.

Subsequently, as illustrated in FIG. 1013, a tape TP is adhered to a front surface F1 (upper surface) side of the semiconductor wafer Wf. Subsequently, as illustrated in FIG. 10C, the semiconductor layer 10 is made thin by polishing a back surface F2 side of the semiconductor wafer Wf; and the tape TP is detached.

Figure 10D:
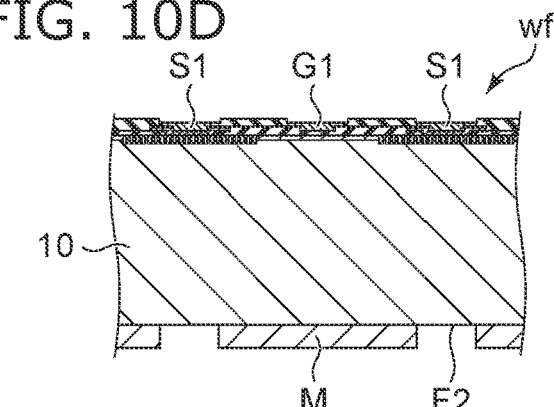
Figure 10B:
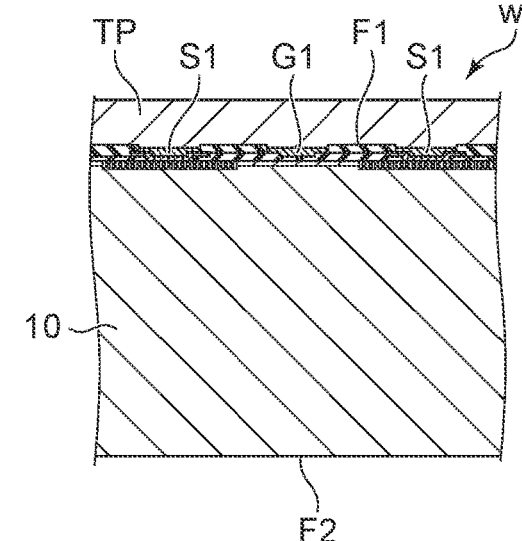

Subsequently, as illustrated in FIG. 10D, a resist layer M is stacked on the back surface F2 side of the semiconductor wafer Wf. For example, the resist layer M is patterned by photolithography according to the formation pattern of the first semiconductor part 10$a$.

Figure 10E:
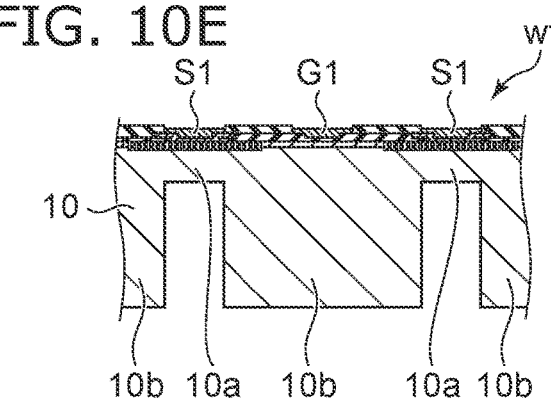
Figure 10C:
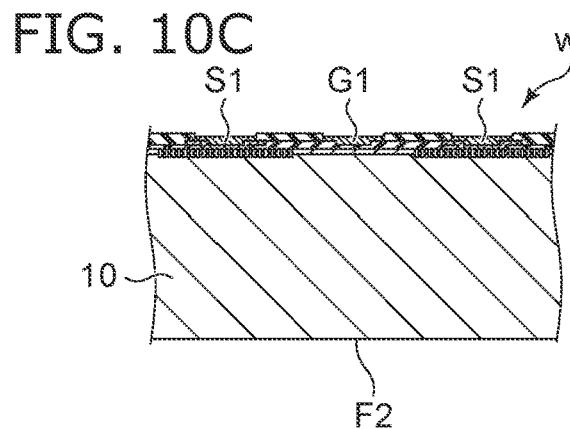

The lower surface (back surface F2) side of the semiconductor layer 10 is etched using the patterned resist layer M as a mask (an etching process). Thereby, as illustrated in FIG. 10E, the first semiconductor part 10$a$ and the second semiconductor part 10$b$ that is thicker than the first semiconductor part 10$a$ are formed in the semiconductor layer 10. At least a portion of the first semiconductor part 10$a$ is positioned below the source electrode pads S1 and S2. Subsequently, the resist layer M is removed.

Figure 10F:
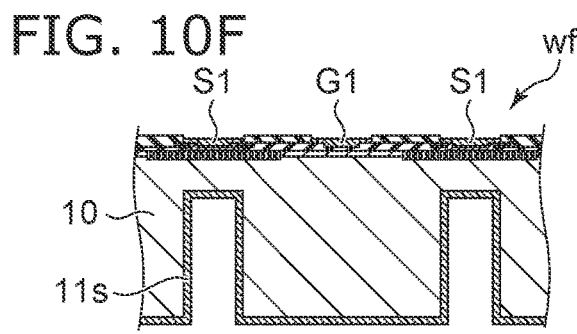
Figure 10G:
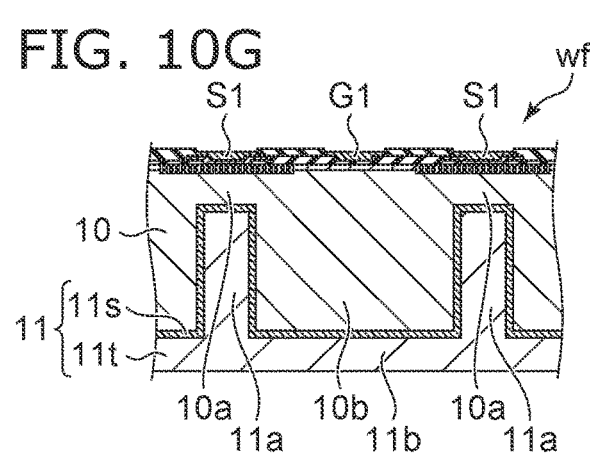

Subsequently, as illustrated in FIG. 10F, a seed layer 11$s$ is formed on the lower surface of the semiconductor layer 10 by sputtering. Subsequently, as illustrated in FIG. 10G, a metal film lit is formed by, for example, plating on the lower surface of the seed layer 11$s$ (a conductive layer formation process). Thereby, the lower electrode 11 is formed on the lower surface side of the semiconductor layer 10. The lower electrode 11 includes the first conductive region 11$a$ that is positioned under the first semiconductor part 10$a$, and the second conductive region 11$b$ that is positioned under the second semiconductor part 10$b$. The second conductive region 11$b$ is thinner than the first conductive region 11$a$. Subsequently, the semiconductor wafer Wf is singulated into chips by dicing as necessary.

The semiconductor device 100 can be manufactured as described above. Although a method is described in the example in which the front surface of the semiconductor layer 10 is protected by the tape TP and the back surface is polished, a method can be used in which a hard material such as glass or the like is used as the support substrate, and the support substrate is detached after the lower electrode formation. According to embodiments, a semiconductor device and a method for manufacturing a semiconductor device can be provided in which the warp can be suppressed while suppressing the on-resistance.

Embodiments may include the following configurations.

Configuration 1. A semiconductor device, comprising:

a first conductive layer including a first conductive region and a second conductive region, an unevenness being provided in at least one of an upper surface or a lower surface of the first conductive layer, the second conductive region being thinner than the first conductive region;

a semiconductor layer located on the first conductive layer, the semiconductor layer including a first semiconductor region of a first conductivity type, a second semiconductor region located on a portion of the first semiconductor region, the second semiconductor region being of a second conductivity type, a third semiconductor region located on the second semiconductor region, the third semiconductor region being of the first conductivity type, a fourth semiconductor region located on an other portion of the first semiconductor region, the fourth semiconductor region being of the second conductivity type, and a fifth semiconductor region located on the fourth semiconductor region, the fifth semiconductor region being of the first conductivity type;

a first control electrode facing the first, second, and third semiconductor regions via a first insulating film;

a second control electrode facing the first, fourth, and fifth semiconductor regions via a second insulating film;

a first electrode pad located above the semiconductor layer and electrically connected with the third semiconductor region; and a second electrode pad located above the semiconductor layer and electrically connected with the fifth semiconductor region, at least a portion of the first conductive region being positioned below the first and second electrode pads.

Configuration 2. The device according to configuration 1, wherein the first conductive region is continuous from a region below the first electrode pad to a region below the second electrode pad.

Configuration 3. The device according to configurations 1 or 2, wherein an area in which the first conductive region is located surrounds the first and second electrode pads in a plane perpendicular to a first direction, and the first direction is from the first conductive layer toward the semiconductor layer.

Configuration 4. The device according to any one of configurations 1 to 3, wherein
the semiconductor layer includes:
  a first semiconductor part located on the first conductive region; and
  a second semiconductor part located on the second conductive region, and
  the first semiconductor part is thinner than the second semiconductor part.

Configuration 5. The device according to configuration 4, wherein
  the second conductive region is thinner than the second semiconductor part.

Configuration 6. The device according to configuration 5, wherein
  the first semiconductor part is thinner than the first conductive region.

Configuration 7. The device according to any one of configurations 1 to 6, wherein
  the second conductive region does not overlap the first and second electrode pads in a first direction, and
  the first direction is from the first conductive layer toward the semiconductor layer.

Configuration 8. The device according to any one of configurations 1 to 7, wherein
  a plurality of the first electrode pads is provided,
  a plurality of the second electrode pads is provided, and
  the second conductive region is positioned below a region between one of the first electrode pads and an other one of the first electrode pads and below a region between one of the second electrode pads and an other one of the second electrode pads.

Configuration 9. A method for manufacturing a semiconductor device, the method comprising:
  preparing a semiconductor wafer, the semiconductor wafer including
    a semiconductor layer including
      a first semiconductor region of a first conductivity type,
      a second semiconductor region located on a portion of the first semiconductor region, the second semiconductor region being of a second conductivity type,
      a third semiconductor region located on the second semiconductor region, the third semiconductor region being of the first conductivity type,
      a fourth semiconductor region located on an other portion of the first semiconductor region, the fourth semiconductor region being of the second conductivity type, and
      a fifth semiconductor region located on the fourth semiconductor region, the fifth semiconductor region being of the first conductivity type,
    a first control electrode facing the first, second, and third semiconductor regions via a first insulating film,
    a second control electrode facing the first, fourth, and fifth semiconductor regions via a second insulating film,
    a first electrode pad located above the semiconductor layer and electrically connected with the third semiconductor region, and
    a second electrode pad located above the semiconductor layer and electrically connected with the fifth semiconductor region;

etching a lower surface side of the semiconductor layer to form a first semiconductor part and a second semiconductor part in the semiconductor layer, the second semiconductor part being thicker than the first semiconductor part, at least a portion of the first semiconductor part being positioned below the first and second electrode pads; and
forming a first conductive layer at the lower surface side of the semiconductor layer,
the first conductive layer including
  a first conductive region positioned under the first semiconductor part, and
  a second conductive region positioned under the second semiconductor part, the second conductive region being thinner than the first conductive region.

According to the embodiments above, the relative levels of the impurity concentrations between the semiconductor regions can be confirmed using, for example, a SCM (scanning capacitance microscope). The carrier concentration in each semiconductor region can be considered to be equal to the activated impurity concentration in each semiconductor region. Accordingly, the relative levels of the carrier concentrations between the semiconductor regions also can be confirmed using SCM. The relative levels of the impurity concentrations between the semiconductor regions can be considered to correspond to the relative levels of the carrier concentrations between the semiconductor regions. Also, the impurity concentration in each semiconductor region can be measured by, for example, SIMS (secondary ion mass spectrometry).

When both an impurity that forms donors and an impurity that forms acceptors are included in a region, the "impurity concentration" may be the net impurity concentration after the impurities have canceled.

In this specification, being "electrically connected" includes not only the case of being connected in direct contact, but also the case of being connected via another conductive member, etc.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor device, comprising:
  a first conductive layer including a first conductive region and a second conductive region, an unevenness being provided in at least one of an upper surface or a lower surface of the first conductive layer, the second conductive region being thinner than the first conductive region;
  a semiconductor layer located on the first conductive layer, the semiconductor layer including a first semiconductor region of a first conductivity type, a second semiconductor region located on a portion of the first semiconductor region, the second semiconductor region being of a second conductivity type, a third semiconductor region located on the second semiconductor region, the third semiconductor region being of the first conductivity type, a fourth semiconductor region located on an other portion of the first semiconductor region, the fourth semiconductor region being of the second conductivity type, and a fifth semiconductor region located on the fourth semiconductor region, the fifth semiconductor region being of the first conductivity type;

a first control electrode facing the first, second, and third semiconductor regions via a first insulating film;

a second control electrode facing the first, fourth, and fifth semiconductor regions via a second insulating film;

a first electrode pad located above the semiconductor layer and electrically connected with the third semiconductor region; and a second electrode pad located above the semiconductor layer and electrically connected with the fifth semiconductor region, at least a portion of the first conductive region being positioned below the first and second electrode pads, the first control electrode being arranged with the second and third semiconductor regions in a second direction, the first conductive region including a protruding portion protruding in a first direction relative to the second conductive region, the protruding portion being arranged with the first electrode pad in the first direction perpendicular to an upper surface of the semiconductor layer, a length of the protruding portion along the first direction being longer than the length of the first control electrode along the first direction, the second direction being perpendicular to the first direction.

2. The device according to claim 1, wherein the first conductive region is continuous from a region below the first electrode pad to a region below the second electrode pad.

3. The device according to claim 1, wherein an area in which the first conductive region is located surrounds the first and second electrode pads in a plane perpendicular to the first direction.

4. The device according to claim 1, wherein the semiconductor layer includes:

a first semiconductor part located on the first conductive region; and a second semiconductor part located on the second conductive region, and the first semiconductor part is thinner than the second semiconductor part.

5. The device according to claim 4, wherein the second conductive region is thinner than the second semiconductor part.

6. The device according to claim 5, wherein the first semiconductor part is thinner than the first conductive region.

7. The device according to claim 1, wherein the second conductive region does not overlap the first and second electrode pads in the first direction.

8. The device according to claim 1, wherein a plurality of the first electrode pads is provided, a plurality of the second electrode pads is provided, and the second conductive region is positioned below a region between one of the first electrode pads and an other one of the first electrode pads and below a region between one of the second electrode pads and an other one of the second electrode pads.

9. A method for manufacturing a semiconductor device, the method comprising:

preparing a semiconductor wafer, the semiconductor wafer including a semiconductor layer including a first semiconductor region of a first conductivity type, a second semiconductor region located on a portion of the first semiconductor region, the second semiconductor region being of a second conductivity type, a third semiconductor region located on the second semiconductor region, the third semiconductor region being of the first conductivity type, a fourth semiconductor region located on an other portion of the first semiconductor region, the fourth semiconductor region being of the second conductivity type, and a fifth semiconductor region located on the fourth semiconductor region, the fifth semiconductor region being of the first conductivity type, a first control electrode facing the first, second, and third semiconductor regions via a first insulating film, a second control electrode facing the first, fourth, and fifth semiconductor regions via a second insulating film, a first electrode pad located above the semiconductor layer and electrically connected with the third semiconductor region, and a second electrode pad located above the semiconductor layer and electrically connected with the fifth semiconductor region, the first control electrode being arranged with the second and third semiconductor regions in a second direction, the first conductive region including a protruding portion protruding in a first direction relative to the second conductive region, the protruding portion being arranged with the first electrode pad in the first direction perpendicular to an upper surface of the semiconductor layer, a length of the protruding portion along the first direction being longer than the length of the first control electrode along the first direction, the second direction being perpendicular to the first direction;

etching a lower surface side of the semiconductor layer to form a first semiconductor part and a second semiconductor part in the semiconductor layer, the second semiconductor part being thicker than the first semiconductor part, at least a portion of the first semiconductor part being positioned below the first and second electrode pads; and forming a first conductive layer at the lower surface side of the semiconductor layer, the first conductive layer including a first conductive region positioned under the first semiconductor part, and a second conductive region positioned under the second semiconductor part, the second conductive region being thinner than the first conductive region.

10. The device according to claim 1, wherein the semiconductor layer including a recess recessed upward from a lower surface of the semiconductor layer, the recess is arranged with the first electrode pad in the first direction, a portion of the first conductive region is provided in the recess, and a length of the recess along the first direction is longer than the length of the first control electrode along the first direction.

11. A semiconductor device, comprising:

a first conductive layer including a first conductive region and a second conductive region, an unevenness being provided in at least one of an upper surface or a lower surface of the first conductive layer, the second conductive region being thinner than the first conductive region;

a semiconductor layer located on the first conductive layer, the semiconductor layer including a first semiconductor region of a first conductivity type, a second semiconductor region located on a portion of the first semiconductor region, the second semiconductor region being of a second conductivity type, a third semiconductor region located on the second semiconductor region, the third semiconductor region being of the first conductivity type, a fourth semiconductor region located on an other portion of the first semiconductor region, the fourth semiconductor region being of the second conductivity type, and a fifth semiconductor region located on the fourth semiconductor region, the fifth semiconductor region being of the first conductivity type;

a first control electrode facing the first, second, and third semiconductor regions via a first insulating film;

a second control electrode facing the first, fourth, and fifth semiconductor regions via a second insulating film;

a first electrode pad located above the semiconductor layer and electrically connected with the third semiconductor region; and a second electrode pad located above the semiconductor layer and electrically connected with the fifth semiconductor region, at least a portion of the first conductive region being positioned below the first and second electrode pads, the first conductive region including a protruding portion protruding in a first direction relative to the second conductive region, the protruding portion being arranged with the first electrode pad in the first direction perpendicular to an upper surface of the semiconductor layer, an area of the protruding portion in a plane perpendicular to a first direction being larger than an area of the first electrode pad in the plane.

12. The device according to claim 11, wherein the semiconductor layer including a recess recessed upward from a lower surface of the semiconductor layer, the recess is arranged with the first electrode pad in the first direction, a portion of the first conductive region is provided in the recess, and an area of the recess in the plane is larger than the area of the first electrode pad in the plane.

\* \* \* \* \*